United States Patent [19]

Slye et al.

[11] Patent Number: 4,835,464
[45] Date of Patent: May 30, 1989

[54] DECOUPLING APPARATUS FOR USE WITH INTEGRATED CIRCUIT TESTER

[75] Inventors: John R. Kingery, Edina; Bradley D. Slye, Golden Valley; David A. Johnson, Minneapolis, all of Minn.

[73] Assignee: Micro Component Technology, Inc., St. Paul, Minn.

[21] Appl. No.: 145,668

[22] Filed: Jan. 14, 1988

Related U.S. Application Data

[63] Continuation of Ser. No. 41,683, Apr. 23, 1987, abandoned, which is a continuation of Ser. No. 732,968, May 13, 1985, abandoned.

[51] Int. Cl.⁴ ........................ G01R 31/22; G01R 1/06
[52] U.S. Cl. ........................... 324/158 F; 324/158 P; 324/73 PC; 324/72.5; 439/70; 439/260
[58] Field of Search ........... 324/158 F, 158 P, 73 PC, 324/123 R, 110; 361/212, 220; 439/70, 71, 72, 73, 260

[56] References Cited

U.S. PATENT DOCUMENTS

| | | | |
|---|---|---|---|
| 3,377,514 | 4/1968 | Ruehlemann et al. | 324/158 F |
| 3,441,853 | 4/1969 | Bodine | 324/158 F |
| 3,573,617 | 4/1971 | Randolph et al. | 324/158 F X |
| 3,701,077 | 10/1972 | Kelly, Jr. | 324/158 F X |
| 4,068,170 | 1/1978 | Chayka et al. | 324/158 F X |
| 4,419,626 | 12/1983 | Cedrone et al. | 324/158 F X |
| 4,560,216 | 12/1985 | Egawa | 324/158 F |
| 4,689,556 | 8/1987 | Cedrone | 324/158 F X |

FOREIGN PATENT DOCUMENTS 3536124 4/1986 Fed. Rep. of Germany ... 324/158 F

Primary Examiner—Reinhard J. Eisenzopf
Assistant Examiner—Vinh P. Nguyen
Attorney, Agent, or Firm—Lawrence M. Nawrocki

[57] ABSTRACT

An apparatus for decoupling one contact (40) of an integrated circuit device (12) from a primary power source provided by a tester. The apparatus includes a rack mount (58) applied over each of two pluralities of probe fingers (16) which, together with other structure, provide electronic communication between the contacts (40) of the device (12) being tested and the primary power soruce. Each of the mounts (58) has a plurality of recesses (60) formed therein for receipt of various chip capacitors (92) and shorting elements (94). The recesses (60) pass fully through their respective rack mounts (58), and a contact strip (78) is positioned in an overlying relationship to a corresponding rack mount (58) to secure the chip capacitors (92) and shorting elements (94), selectively inserted into the various recesses (60), in operative electronic engagement with probe fingers (16) corresponding to the recesses (60) in which the various capacitors (92) and shorting elements (94) are received. Projections (86) extending from the contract strips (78) are provided for this purpose. Electronic communication between the various pins (40) is completed by providing a decoupling strap (82) bridging a gap between opposite, facing contact strips (78).

8 Claims, 2 Drawing Sheets

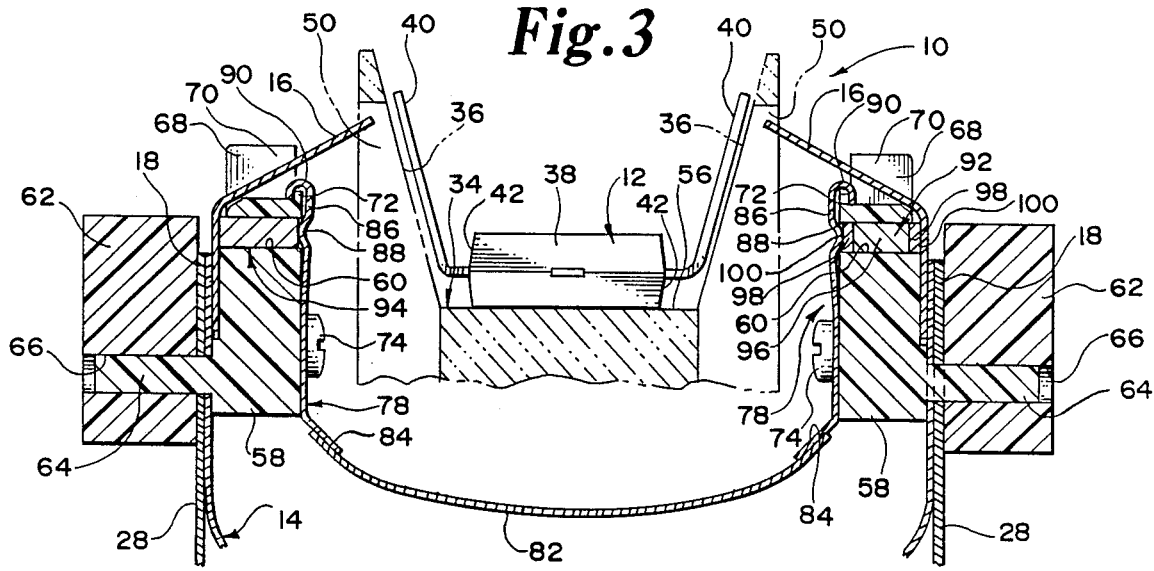
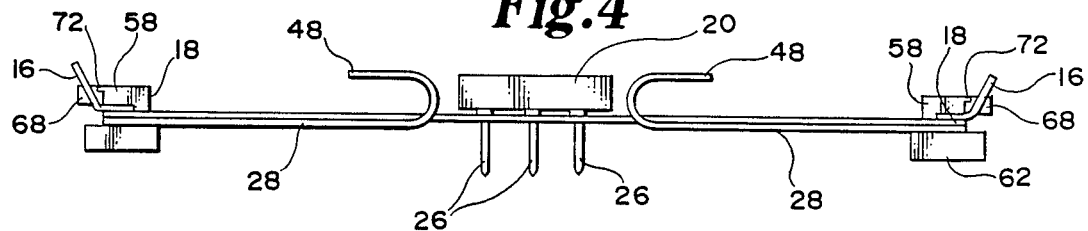
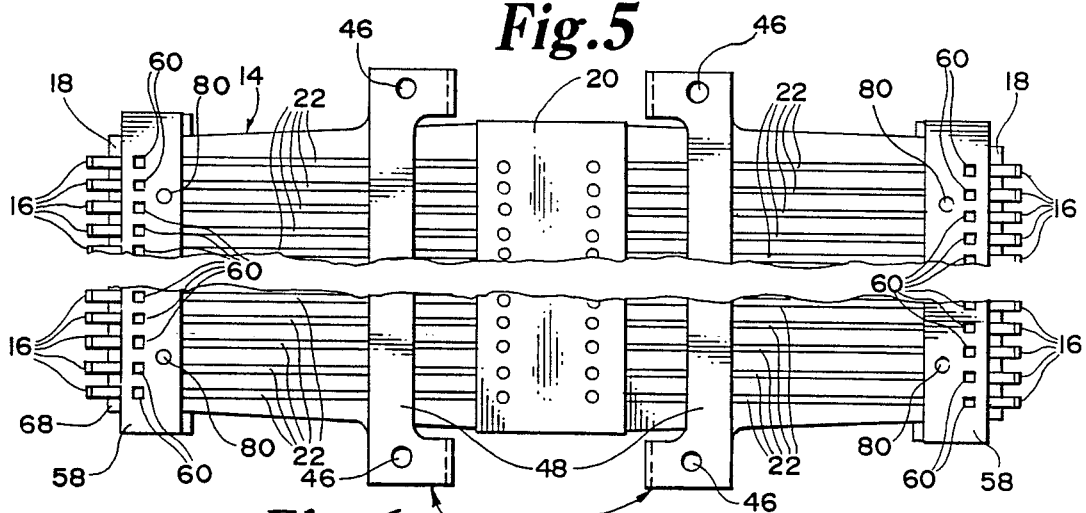
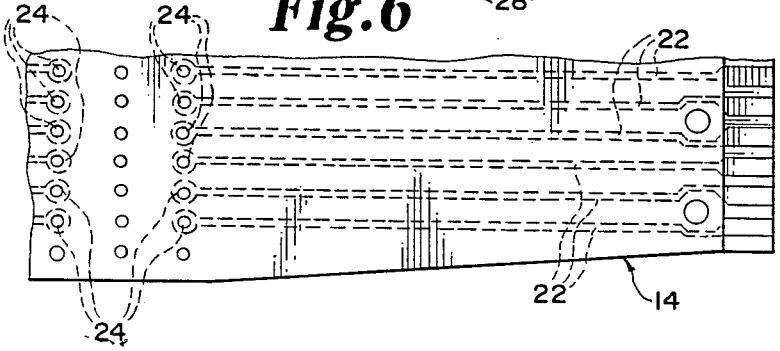

DECOUPLING APPARATUS FOR USE WITH INTEGRATED CIRCUIT TESTER

This application is a continuation of application Ser. No. 041,683, filed Apr. 23, 1987, which is a continuation of application Ser. No. 732,968,filed May 13, 1985, both now abandoned.

TECHNICAL FIELD

The present invention deals broadly with the field of integrated circuits and devices for testing such electronic components in order to ascertain the integrity and overall quality of such components. More narrowly, however, the present invention relates to test sites of handlers which maneuver devices to be tested to a test site interfacing with a tester. A preferred embodiment of the invention focuses upon apparatus provided for decoupling a primary power source at the contactor in order to reduce high frequency electrical noise.

BACKGROUND OF THE INVENTION

Handlers for maneuvering integrated circuit devices to a test site interfacing with a tester mechanism vary in their construction and design. A number of factors such as the type of integrated circuit to be handled, the desired speed of handling, etc. bear upon the specific construction to be implemented. Handlers vary from manual and/or semi-automatic structures which provide basic input and output movement of devices to be tested across a test site, to sophisticated, essentially fully automated systems capable of communicating with a host computer. While less sophisticated devices are capable of handling a relatively limited number of devices per unit time, more sophisticated handlers are capable of a throughput significantly in excess of apparatus which were state-of-the-art only a few years ago.

It is recognized that handler apparatus present unique problems, since they, optimally, should be easy to operate, yet possess a sufficient speed of operation to be economical in use. Additionally, such apparatus should solve numerous electrical, thermal, environmental, and mechanical problems so as to render testing of the integrated circuit devices accurate.

As is dictated by the prior art, device to testhead contact is a major electrical problem which is encountered. Thermal problems result from the need to cool and heat devices before testing in order to simulate actual operating conditions of the environments in which the devices will ultimately be installed. Such conditions can include temperatures ranging from $-60°$ Centigrade to $+160°$ Centigrade.

Such integrated circuit handlers are also subject to various other environmental conditions. For example, such apparatus must be able to withstand both high and low levels of humidity, static voltages, and frost build-up which might occur during cold-environment testing.

One type of integrated circuit device which is processed by a handler of the type previously described is known as a dual in-line package (DIP). Such devices vary in size. Typically, DIPs vary between devices having a width of 300 mils to devices having a width of 900 mils. Depending upon the width of the device, the number of pins or leads provided will also vary. While on smaller devices as few as six pins might be provided, larger devices might have as many as 64 pins.

As previously indicated, handlers must also overcome various electrical problems. A significant electrical problem that handlers must address is the need to electrically decouple respective primary power sources provided by the tester at various pins of the DIP in order to eliminate both primary power supply and ground noise.

Prior art structures have sought to effect decoupling by providing a single capacitor electronically intermediate and at the power pin and the ground pin of the device under test (DUT). Because in many DIPs the power pin, or one of a plurality of power pins, is at a standard location on the device to be tested, the decoupling capacitor was able to be "hardwired" at a location at a test site so that it could associate with the power pin of the device under test when that device was in its test position.

Similarly, since in some DIP structures the ground pin, or one of a plurality of ground pins, is at a standard location along the body of the DIP, a shorting element could be "hardwired" at a fixed location at the test site. A path between the shorting element and the decoupling capacitor could be provided, and decoupling could, thereby, be effected.

As the sophistication of DIPs has increased, however, the positioning of power pins and ground pins can vary from device to device. Special application integrated circuit DIPs have even been developed wherein positioning of power pins and ground pins is completely random conforming to no industry standard. As previously intimated, however, even in some mass-produced DIPs, the positioning of power pins and ground pins defies known norms.

It is to these problems and desirable features dictated by the prior art that the present invention is directed. It is a universal decoupling apparatus which can be used for virtually any size of DIP, having any number of pins, and wherein power pins and ground pins are distributed about the periphery of the DIP main body at locations which conform to no norm.

SUMMARY OF THE INVENTION

The present invention is an apparatus for effecting decoupling at any pin of a DIP from a primary source of power provided by the tester, with respect to various other of the DIP pins. Typically, a test site of a handler cycling the DUTs therethrough includes a plurality of probes or contacts, each of which communicates electronically with the tester. A plurality of decoupling capacitors and shorting elements of a construction as known in the prior art are provided. The invention includes means, proximate each of the probes, capable of accepting a decoupling capacitor or shorting element. Structure is provided to dispose the various capacitors and shorting elements in operative engagement with selected probes Further, means are provided to afford electronic communication between the various decoupling capacitors and shorting elements engaged with the selected probes. As can be seen, such a structure permits selective decoupling between, for example, a power pin and ground pin on the DUT regardless of their relative positions on the integrated circuit device being tested.

Typically, the decoupling capacitors and shorting elements utilized in practicing the invention would be shaped and sized similar to one another. A pair of rack mounts can be provided at the test site assembly to receive the capacitors and shorting elements. In a test site wherein pairs of pluralities of probes are provided on opposite sides of the test site to be brought into engagement with the pins of a DIP when the DIP is introduced into the test site, each of the rack mounts can overlie a corresponding plurality of probes, and a plurality of recesses corresponding in number to the number of probes in the gang which the mount overlies can be formed in each mount.

The recesses provided in each mount can extend fully therethrough, so that a capacitor, for example, placed into one of the recesses can, at one end, engage a probe with which the recess is associated and, at its other end, be accessible to being connected to a shorting probe placed in another of the recesses As will be able to be seen from this disclosure, various decoupling capacitors and shorting probes can, thereby, be interchanged and placed in various of the recesses depending upon the positioning of the power pins, etc. on the DUT.

Electronic communication between the various capacitors and shorting elements can be provided by bridging the distance between the rack mounts with a flexible, conductive strap. The strap can be secured, at one end thereof, to a contact strip overlying a first of the rack mounts and, at the other end, to a contact strip overlying the other of the rack mounts.

Each contact strip can be provided with a plurality of projections which, when the strips are in place, occlude the various recesses formed in its respective mount. The contact strips and their projections can be highly conductive in nature so that electronic communication will extend between the various capacitors and shorting elements in the recesses to the bridging, conductive strap.

In a handler designed to test, for example, DIPs, the finger probes at the test site are typically disposed for rocking into engagement with the pins of the DUT when the integrated circuit device is in position at the test site, and out of engagement with the pins and away therefrom when testing is completed and the device is to be afforded egress so that another device can be introduced into the test site. In the prior art, the rocking motion imparted to the probe fingers has been initiated by a solenoid or other type of actuator. In certain handlers, cam actuation might be appropriate.

Regardless of the actuator used, however, the present invention can provide a pair of dielectric blocks, each matable with one of the rack mounts, to serve as members which can be engaged by actuators. With such actuation, the flexibility of the conductive strap bridging the distance between the rack mounts would facilitate the probe finger movement toward and away from the DUT at the test site.

The present invention is, therefore, apparatus to permit selective and universal decoupling of various DUT pins with respect to other pins. More specific features and advantages obtained in view of those features will become apparent with reference to the DETAILED DESCRIPTION OF THE INVENTION, appended claims, and accompanying drawing figures.

BRIEF DESCRIPTION OF THE DRAWINGS

FIG. 3 is a sectional view taken generally along the line 3—3 of FIG. 1, the elements illustrated therein being enlarged;

FIG. 4 is an end elevational view of a transmission line connector, with which the present invention can be used, in a flattened configuration;

FIG. 5 is a top plan view of the assembly of FIG. 4; and

FIG. 6 is a partial top-plan, detail view of the flexible transmission line connector as shown in FIGS. 4 and 5, some parts thereof being removed for clarity.

DETAILED DESCRIPTION OF THE INVENTION

Figure 1:
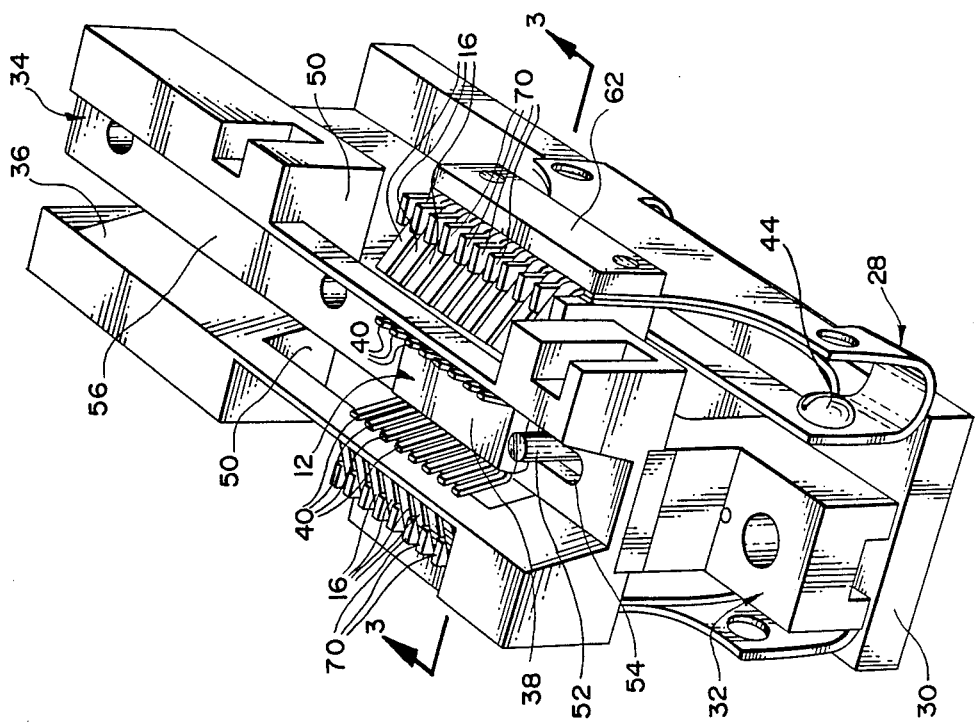
FIG. 1 is a perspective view of the present invention as in use in the test site of a DIP handler.

Referring now to the drawings wherein like reference numerals denote like elements throughout the several views, FIG. 1 illustrates a structure in accordance with the present invention as used in a test site 10 of an integrated circuit handler interfacing with a tester. The decoupling apparatus in accordance with the present invention can be used, as is apparent from the figures, in conjunction with a test site configured for processing of dual in-line packages (DIPs) 12. It will be understood, however, that, although it is envisioned that the primary application for the particular decoupling apparatus disclosed and claimed herein would be in a handler/tester assembly designed for DIPs, handlers capable of cycling other types of integrated circuit devices might also be adapted to incorporate the present invention.

FIGS. 4, 5, and 6 illustrate, in part, a transmission line connector 14, as known in the prior art, for use in such test sites. Such transmission line connector structures, typically, have a plurality of probe fingers 16 mounted at opposite ends 18 thereof with an intersecting foot insulator 20 adjacent a central portion of the connector 14. The connector 14, as known in the prior art, is of a flex-tape material and has a plurality of impedance controlled traces 22 extending from each of the probe fingers 16 to plated through holes 24 proximate the center line of the connector 14.

The foot insulator 20 would, typically, be manufactured from a plastic-type material. The insulator 20 carries a plurality of pins 26, and, with its pins 26, is plugged into the plated through holes 24 formed centrally in the transmission line connector 14. The connector 14 can, in turn, by use of the pins 26 extending through the holes 24 centrally in the connector 14, be plugged into a socket in a test head adaptor (not shown) to render it in electronic communication with a tester.

FIGS. 4 and 5, further, illustrate a pair of return spring structures 28, one on either side of the foot insulator 20. These return springs 28 function to accomplish an intended purpose as will be discussed hereinafter.

Additionally, FIGS. 4 and 5 illustrate components of the decoupling apparatus of the present invention. These components will, however, be discussed in more detail with reference to other figures.

Figure 2:
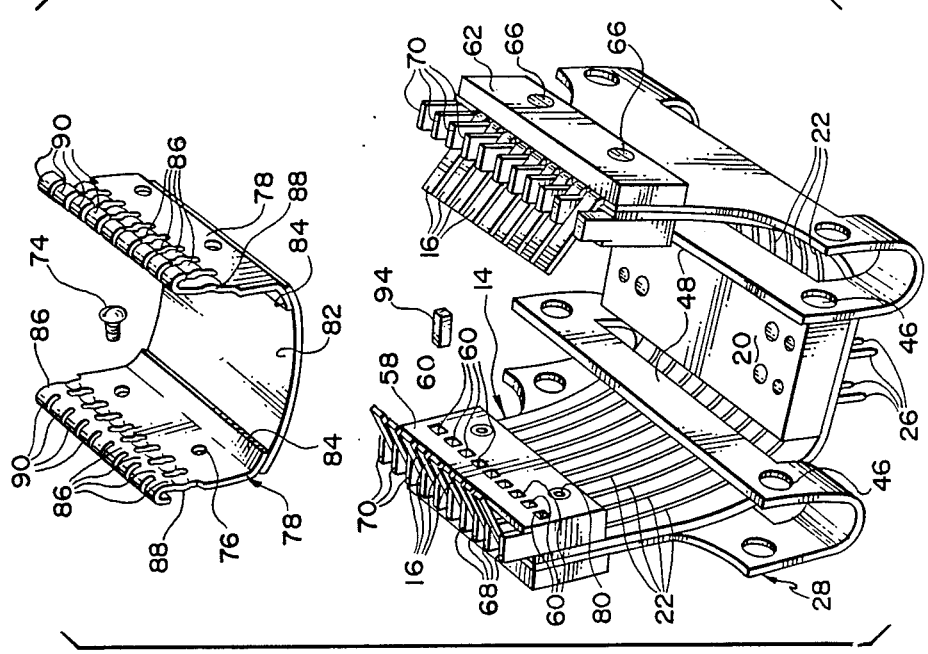
FIG. 2 is a perspective view of the assembly elements without the DIP track, and shown partially exploded.

Referring now to FIGS. 1, 2, and 3, FIG. 1 illustrates a plate 30 with respect to which the test site can be disposed above. A central, longitudinally-extending support 32 is seated on the plate 30. The support 32 mounts a track 34, having opposite lateral walls 36, down which integrated circuit devices (in this case DIPs 12) pass.

Such DIPs 12 are of a construction well known in the prior art. They include a main body portion 38, generally rectangular in shape, and pluralities of contact pins 40 extending from opposite longitudinal edges 42 of the main body portion 38 The pins 40 flare slightly outwardly with respect to a plane perpendicular to a surface of the main body portion 38. The lateral walls 36 of the track 34, therefore, are, similarly, flared outwardly to accommodate the pins 40.

The flexible transmission line connector 14 is mounted to the support 32 by securing members, such as screws 44, passing through apertures 46 in wings 48 of the return springs 28 and into the support 32. Fixed positioning of the transmission line connector relative to the support 32 is accomplished by fastening foot insulator 20, with pins 26, onto support 32.

The probe fingers 16, as a result of the affixation of the transmission line connector 14 to the support 32 by the wings 48 of the return springs 28, are disposed upwardly from the foot insulator 20 and proximate apertures 50 provided in the side walls 36 of the track 34. The return springs 28 bias the probe fingers 16 outwardly away from the apertures 50 in the side walls 36 so as not to obstruct passage of DIPs 12 down the track 34. Actuators (not shown) can, however, be provided to urge the probe fingers 16 inwardly through the apertures 50 and into engagement with the pins 40 of a DIP 12 in a station at the test site 10.

A stop 52 can be provided to maintain the DIP 12 to be tested in a desired station. The stop 52 can be disposed for reciprocation upwardly and downwardly through an aperture 54 formed in the floor 56 of the track 34. The aperture 54 can be elongated along the axis of the track 34 in a direction down which DIPs pass in order to adjust the location of the stop 52 and, thereby, vary the relative position of a DIP 12 in the station with respect to the probe fingers 16. The definition of the station can be changed, therefore, depending upon the size of the DIP 12, the number of pins 40 it carries, and other factors.

As best seen in FIGS. 2 and 3, a rack mount 58, in accordance with the invention, is secured in place overlying each lateral plurality of probe fingers 16 Each rack mount 58 extends substantially across the length of the transmission line connector 14 at the location of its proximity thereto. The rack mounts 58 are provided with pluralities of recesses 60, each plurality of recesses 60 corresponding in number to the number of probe fingers 16 provided. The recesses 60 extend fully through the thickness of the rack mount 58 and are positioned in locations such that, when the rack mount 58 is fixedly secured in a location relative to the fingers 16, each of the probe fingers 16 will be accessible through one of the recesses 60.

As previously discussed, the return springs 28 bias the probe fingers 16 outwardly away from the track 34 down which DIPs 12 pass. Further, as previously indicated, actuators can be provided to overcome this bias and urge the probe fingers 16 into engagement with the pins 40 of a DIP 12 in the test site station when it is so desired. A block 62 can be secured in position overlying the outwardly facing surface of each return spring 28 and can be disposed to be engaged by its respective actuator.

As best seen in FIG. 3, each rack mount 58 can carry therewith an integrally formed pin 64. The pin 64 of one rack mount 58 can pass through registered apertures in the transmission line connector 14 and the respective return spring 28 and into a port 66 formed in the corresponding engagement block 62. Both the rack mount 58, with its protruding pin portion 64, and engagement block 62 are formed from a dielectric material, and sonic welding can be utilized to effect secure retention of the mount rack pin 64 to the inner surface of the port 66 in the engagement block 62. The transmission line connector 14 and the return spring 28 can, thereby, be sandwiched tightly between the rack mount 58 and engagement block 62.

An upper extension 68 of each mount 58 can be provided with a plurality of slits 70 to accommodate inward angling of the probe fingers 16. The lower, inner end of the each of these slits 70 can be provided with an upwardly turned lip 72 for a purpose that will be described hereinafter.

FIGS. 2 and 3 illustrate a contact strip/decoupling strap assembly which bridges the gap between the two facing rack mounts 58. The assembly can be secured to each of the rack mounts by passing appropriate securing fasteners 74 through apertures 76 in the contact strips 78 and into holes 80 provided in the rack mounts 58.

Both the contact strips 78 and the strap 82 soldered to lower extremities 84 of the contact strips 78 are formed from highly conductive materials for a purpose to be discussed hereinafter. The strap 82 bridging the distance between the contact strips 78 and soldered to lower extremities thereof would, typically, be made from a thin copper sheet. The surfaces of the copper sheet can be provided with an insulating film.

Each contact strip 78 is provided with a plurality of upwardly extending projections 86. The projections 86 are disposed at axial locations therealong so that, when the contact strip 78 is secured to its respective rack mount 58, each projection 86 will overlie one of the recesses 60 formed in the mount 58.

As best seen in FIG. 3, each projection 86 is provided with a dimple 88 which projects inwardly into its respective recess 60 and a curled upper end 90 which hooks around the upwardly extending lip 72 in the respective slit 70 of the rack mount 58. By hooking the curled upper ends 90 of the contact strip projections 86 over the upwardly extending lips 70 of the rack mounts 58, tight engagement and contact can be made with an end of either a decoupling capacitor 92 or shorting element 94 disposed in the particular recess 60. Similarly, the pressure exerted upon the capacitor 92 or shorting element 94 by the dimple 88 will, in turn, urge the opposite end of the capacitor 92 or shorting element 94 into tight engagement with the respective probe finger 16.

In securing the contact strip conductive strap assembly to the rack mount 58, the curled ends 90 of the various projections 86 can be fitted into their respective slits 70 and brought downwardly over the upwardly turned lips 72 onto which they hook. The dimples 88 are formed relative to the curled portions 90 so that, with the curled portions 90 fitted over the lips 72, the dimples 88 will be at the entrances to their respective recesses 60 The assembly can then be securely attached to the rack mounts 58 by use of the screws 74 as previously discussed.

Decoupling of a DIP pin 40 from its primary power supply an the tester, as connected through the transmission line connector 14, is efficiently accomplished by multi-layer ceramic capacitors 92. Such capacitor chips 92 are almost ideal capacitors for high frequency decoupling. As seen in FIG. 3, such a capacitor chip 92 includes a center capacitor portion 96 having solder 98 infused thereto at both of opposite ends. Outwardly facing surfaces 100 of the solder portions 98 can be plated with a gold film. While the solder portions 98 might allow for defective contacting the high coefficient of conductivity of gold overcomes this shortcoming.

The left recess 60, as viewed in FIG. 3, is shown as containing a shorting element 94. Such an element 94 is made from a highly conductive material and functions to complete a circuit path. It will be understood that the decoupling capacitors 92 and shorting elements 94 can be shaped and sized similarly. Further, the recesses 60 in which they can be received can be shaped and sized so that the members inserted therein have a close tolerance to the containing wall.

As can be seen, various decoupling capacitors 92 and shorting elements 94 can be inserted into the recesses 60 proximate the particular probe fingers 16 with respect to which it is either desired or necessary to decouple between. For example, if the third pin on one side of a DIP is a power pin and the fifth pin on the other side of the DIP is a ground pin, a decoupling capacitor 92 can be inserted into the recess 60 proximate the power pin, and a shorting element 94 into the recess 60 proximate the ground pin. Since the strap 82 bridging the contact strips 78 is in electronic communication with the full length of the strips 78, and therefore with each and every projection 86 from the strips 78, a complete circuit will exist between the DIP power pin and the ground pin.

A structure in accordance with the present invention, therefore, has a very universal application with regard to the testing of DIPs 12. As long as each pin 40 of the DIP 12 can be registered with one of the recesses 60 in the rack mount 58, decoupling between any of the pins 40 can be accomplished by inserting decoupling capacitors 92 and shorting elements 94 in the appropriate recesses 60.

Numerous characteristics and advantages of the invention covered by this document have been set forth in the foregoing description. It will be understood, however, that this disclosure is, in many respects, only illustrative. Changes may be made in details, particularly in matters of shape, size, and arrangement of parts without exceeding the scope of the invention. The invention's scope is, of course, defined in the language in which the appended claims are expressed.

What is claimed is:

1. Apparatus, employing a plurality of similarly shaped and sized decoupling capacitors and shorting elements, for decoupling a primary power source provided by a tester, at a positive contact of a integrated circuit device, between the positive contact and one of a negative and neutral lead of the device, comprising:
   (a) a plurality of probes, each electronically communicating with the primary power source provided by the tester and being engageable with a corresponding one of the device contacts;
   (b) a pair of racks, each rack having a plurality of recesses formed therein, each recess being shaped and sized to accommodate one of said decoupling capacitors and shorting elements, said rack for maintaining each of the decoupling capacitors and shorting elements in operative engagement with a designated integrated circuit device handler test site probe; and
   (c) means for providing electronic communication between decoupling capacitors and shorting elements received in operative engagement with various of said probes.

2. Apparatus in accordance with claim 1 wherein said racks comprise dielectric mounts, each having a plurality of recesses formed therein.

3. Apparatus in accordance with claim 2 wherein said decoupling capacitors and shorting elements are interchangeable from one of said recesses to another.

4. In combination with an integrated circuit handler having a test site at which integrated circuit devices processed by the handler are interfaced with a tester, the test site including a plurality of probes, electronically communicating with a primary power source provided by the tester, engageable with corresponding contacts of an integrated circuit device; apparatus, employing a plurality of similarly shaped and sized decoupling capacitors and shorting elements, for decoupling one contact of the integrated circuit devices from the primary power source provided by the tester, and between another contact of the device, comprising:
   (a) a pair of dielectric mounts, one disposed on each of opposite sides of an integrated circuit in position at the handler test site, each of said mounts having a plurality of uniformly shaped and sized recesses formed therein to accommodate the decoupling capacitors and shorting elements to maintain the decoupling capacitors and shorting elements in operative engagement with a designated plurality of the integrated circuit device handle test site probes; and
   (b) means for providing electronic communication between decoupling capacitors and shorting elements received in operative engagement with various of the probes.

5. The combination of claim 4 wherein said electronic communication providing means comprises a metal strap bridging said dielectric mounts.

6. The combination of claim 5 further comprising means for rendering said metal strap in operative electronic communication with the decoupling capacitors and shorting elements.

7. The combination of claim 6 wherein said rendering means comprises a pair of contact strips, each overlying one of said dielectric mounts and including means for engaging and holding decoupling capacitors and shorting elements in said recesses.

8. Apparatus, employing a plurality of similarly shaped and sized decoupling capacitors and shorting elements, for decoupling a primary power source provided by a tester, at a positive contact of an integrated circuit device, between the positive contact and one of a negative and neutral lead of the device, comprising:
   (a) a plurality of probes, each electronically communicating with the primary power source provided by the tester and being engageable with a corresponding one of the device contacts;
   (b) means for receiving one of a decoupling capacitor and a shorting element in operative engagement with each of said probes; and
   (c) a highly conductive strap carrying a plurality of projections for engaging decoupling capacitors and shorting elements received in operative engagement with various of said probes.

* * * * *